(12) United States Patent
Wibben

(10) Patent No.: US 10,367,500 B2
(45) Date of Patent: Jul. 30, 2019

(54) SWITCHING VOLTAGE REGULATOR WITH VARIABLE MINIMUM OFF-TIME

(71) Applicant: Allegro MicroSystems, LLC, Manchester, NH (US)

(72) Inventor: Joshua Wibben, New Brighton, MN (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/835,961

(22) Filed: Dec. 8, 2017

(65) Prior Publication Data

US 2019/0181859 A1 Jun. 13, 2019

(51) Int. Cl.
*H02M 3/158* (2006.01)
*H03K 17/687* (2006.01)
*G05F 1/575* (2006.01)
*H02M 3/157* (2006.01)

(52) U.S. Cl.
CPC ......... *H03K 17/6871* (2013.01); *G05F 1/575* (2013.01); *H02M 3/157* (2013.01); *H02M 3/158* (2013.01); *H03K 2217/0081* (2013.01)

(58) Field of Classification Search
CPC . H02M 2001/0003; H02M 2001/0025; H02M 3/156; H02M 3/157; H02M 3/158; H02M 3/1582; H02M 3/155; H03K 17/6871; H03K 2217/0081
See application file for complete search history.

(56) References Cited

U.S. PATENT DOCUMENTS

| | | | |
|---|---|---|---|
| 5,627,460 A | 5/1997 | Bazinet et al. | |
| 9,155,156 B2 | 10/2015 | Szczeszynski | |
| 9,285,812 B2 | 3/2016 | Wibben et al. | |
| 9,425,785 B1 | 8/2016 | Wibben | |
| 9,537,383 B1 | 1/2017 | Wibben | |
| 9,621,036 B2 | 4/2017 | Wibben | |
| 9,641,070 B2 | 5/2017 | Wibben | |
| 9,774,257 B2 | 9/2017 | Wibben et al. | |
| 2012/0049824 A1* | 3/2012 | Chen ............... | H02M 3/156 323/283 |
| 2014/0062431 A1* | 3/2014 | Yanase ............. | G05F 1/46 323/271 |
| 2014/0152274 A1* | 6/2014 | Lee ................. | G05F 1/595 323/271 |
| 2014/0159680 A1* | 6/2014 | Chiu ............... | G05F 1/468 323/271 |
| 2014/0217999 A1* | 8/2014 | Wibben ............ | H02M 1/36 323/282 |
| 2014/0354250 A1* | 12/2014 | Deng ............... | H02M 3/1582 323/271 |
| 2016/0301303 A1* | 10/2016 | Bari ................ | H02M 3/156 |

\* cited by examiner

*Primary Examiner* — Yusef A Ahmed
*Assistant Examiner* — Shahzeb K Ahmad
(74) *Attorney, Agent, or Firm* — Daly, Crowley, Mofford & Durkee, LLP

(57) ABSTRACT

A switching voltage regulator with variable minimum off-time. The value of the minimum off-time may depend on the voltage across a bootstrap capacitor. The value of the minimum off-time defines a minimum time for a switch to be open and to allow the bootstrap capacitor to charge.

32 Claims, 9 Drawing Sheets

"SWITCHING VOLTAGE REGULATOR WITH VARIABLE MINIMUM OFF-TIME

FIELD

This disclosure relates to switching voltage regulators.

BACKGROUND

For switching regulators, the minimum off-time (i.e. the minimum time that the switch is allowed to be off) may affect how low the input supply voltage can be before the regulator is no longer able to regulate its output. The minimum off-time is often limited by charging requirements of the bootstrap capacitor. For example, the greater the charging requirements of the bootstrap capacitor, the greater the minimum off-time must be to supply that charge. If the minimum off-time is too short, the bootstrap capacitor may not receive enough charge. Of course, bootstrap charging requirements (and thus minimum off-time requirements) may depend on the output voltage, switching frequency, temperature, and other conditions.

Some designs use a fixed minimum off-time based on expected worst-case conditions. However, a fixed minimum off-time may not be flexible enough for use in multiple applications. For example, a shorter minimum off-time may be useful for applications with higher output voltages, where a longer minimum off-time may be useful for applications with lower output voltages.

SUMMARY

In an embodiment, a voltage regulator comprises: a switch having a control terminal, a bootstrap capacitor coupled to the switch, and a control circuit coupled to a control terminal of the switch and configured to open the switch to allow the bootstrap capacitor to charge and close the switch to allow the bootstrap capacitor to stop charging. An oscillator circuit produces a minimum off-time signal that defines a minimum time for the switch to be open and for the bootstrap capacitor to charge. An under-voltage detection circuit monitors a voltage across the bootstrap capacitor and, if the voltage across the bootstrap capacitor is less than a predetermined threshold, generates a signal that causes the switch to remain closed. A minimum off-time circuit adjusts the minimum off-time signal based on a reference voltage and the voltage across the bootstrap capacitor.

In another embodiment, a voltage regulator comprises: a switch having a control terminal, a bootstrap capacitor coupled to the switch, and a control circuit coupled to a control terminal of the switch and configured to open the switch to charge the bootstrap capacitor and close the switch to stop charging the bootstrap capacitor. The voltage regulator includes means for producing a minimum off-time signal that defines a minimum time for the switch to be open and for the capacitor to charge, means for monitoring a voltage across the bootstrap capacitor and, if the voltage across the bootstrap capacitor is less than a predetermined threshold, generating a signal that causes the switch to remain closed; and means for adjusting the minimum off-time signal to allow the bootstrap capacitor to remain in a charged state.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Figure 1:
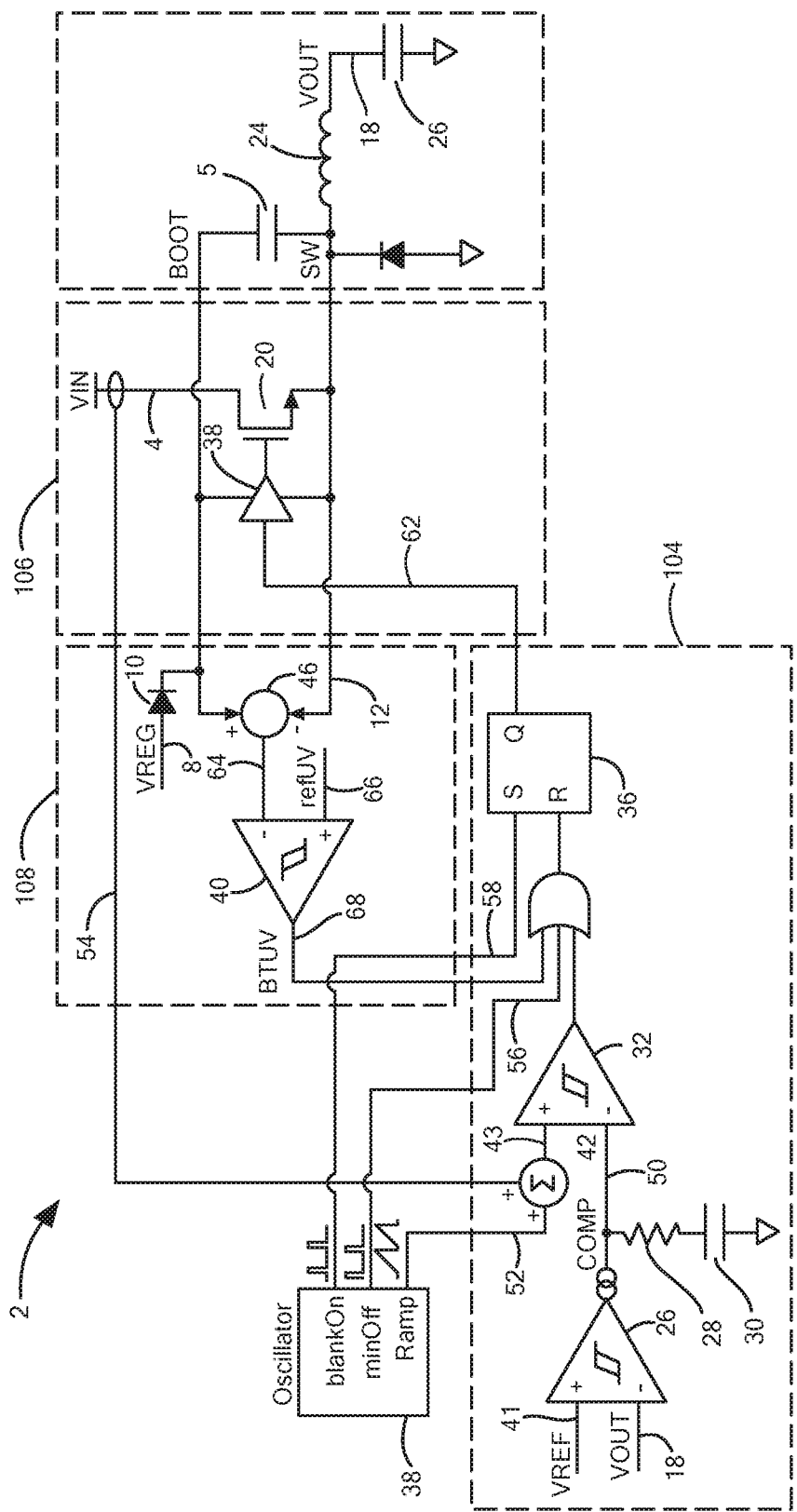
FIG. 1 is a circuit diagram of a buck converter of the prior art.

FIG. 1 is a block diagram of a buck switching voltage regulator 2 of the prior art. In buck switching regulator 10, the bootstrap capacitor 5 is the supply for the N-type high side switch 20 referenced to the switching node (SW). Typically, the bootstrap capacitor 5 is charged when the switching node SW is low.

Voltage regulator 2 includes a typical bootstrap capacitor support with circuit 108, which includes a charging circuit and a boot under voltage protection circuit. The charging circuit comprises diode 10 and VREG supply 8. VREG supply 8 may be generated from an input voltage VIN with a low drop-out ("LDO") regulator and therefore may be limited to a maximum voltage of VIN, if an additional charge pump is not employed. In some applications, VREG may be supplied by VOUT, after VOUT reaches a sufficient voltage at startup.

Diode 10 turns on and charges the bootstrap capacitor 5 to the value of VREG (less a diode voltage drop) when SW node 12 is low. Diode 10 automatically turns off when SW node 12 goes high due to the reverse polarity. The boot capacitor 5 may also be charged through a synchronous switch when SW node 12 is low, which would replace diode 10.

Voltage regulator 2 may also include a boot under voltage protection circuit 108 comprising voltage detector 46, comparator 40, and reference 66 (refUV). Boot voltage detector 46 rejects the common mode changes of SW node 12 providing a continuous monitoring of BOOT-SW translated to BOOT-GND for the low side. When bootstrap capacitor 5 voltage is not sufficiently high the BTUV signal 68 will be high forcing main SR latch 36 continuously off.

Voltage detector circuit 46, receives the voltage across boot capacitor 5 and produces a differential voltage 64 representing the voltage across bootstrap capacitor 5. Comparator 40 is coupled to receive differential voltage signal 64 at one input, and receive voltage refUV (i.e. signal 66) at its other input. Signal 66 may be a reference voltage chosen by design. The output of comparator 40 indicates whether differential voltage signal 64 is greater than or less than reference signal 66.

In embodiments, when turning on high side switch 20 it may be desirable for the bootstrap supply voltage (BOOT- SW) to be above the Vt of high side switch 20. Otherwise, high side switch 20 may weakly turn on and could overheat due to excessive $R_{dson}$.

Voltage regulator 2 may include a current mode control circuit 104. In current mode control, main SR latch 36 may be set by blankOn signal 58 at the start of the period, which turns on high side switch 20. Circuit 104 may include a summation circuit 42, which may produce output signal 43 representing the sum of signal 54 (a representation of the current flowing through switch 12) and ramp signal 52 produced by oscillator 38. Error amplifier 26 may produce signal 50 representing a target inductor current. Comparator 32 may receive signals 50 and 43, and may reset latch 36 (thus turning off switch 20) when VIN is sufficiently high. However, when VIN is too low, the inductor current may not reach the target value and current loop comparator 32 will not reset latch 36 by the end of the period. In this case, minimum off-time signal 56 may reset latch 36 (and thus turn switch 20 off). This may act to maintain a constant switching frequency and provide a minimum required period to charge the boot capacitor 5.

The required minimum off-time may be a function of the boot charging circuit. Each period, charge may be pulled out of the bootstrap capacitor that must be replenished when the switch node (SW) is low. The equation for the charge that must be replenished can be written as Q=Toff*(VREG−Vdiode−Vboot)/Rboot, where Q is the charge that needs to be replenished, Toff is the time the SW node is low (i.e. the off-time), VREG is the supply voltage, Vdiode is the voltage drop across the diode, Vboot is the average boot voltage, and Rboot is the resistance of the boot charging circuit. As illustrated by the equation, if Toff decreases, impedance of the charging circuit (Rboot) must also decrease to maintain the boot voltage (Vboot). In a dropout condition (i.e., a condition where the LDO regulator may lose loop control and can no longer regulate its output) the VREG voltage may be limited by the regulator input voltage or output voltage. In this case, higher output voltages, such as 5V, may result in a value of VREG near 5V when the maximum duty cycle initially occurs. In contrast, a system with a 3.3V output voltage may achieve the maximum duty cycle when the VREG is near 3.3V. These two cases therefore may have different minimum off-time requirements. One benefit of the subject matter disclosed below is that it may allow for an aggressive minimum off-time for higher voltage applications (e.g. 5V) while still allowing operation for a lower voltage application (e.g. 3.3V) by extending the minimum off-time.

For example, if the switching frequency is 2 MHz and the minimum off-time is 50 ns, the resulting duty cycle may be 1−50 ns*2 MHz=90%. Given this, a 5V application will enter dropout when the input voltage is less than about 5V/90%=~5.6V and a 3.3V application will enter dropout when the input voltage is less than about 3.3V/90%=~3.7V. To maintain the boot voltage in the range of 2.5-3V, assuming a 10 ohm boot charge circuit and 0.7V diode drop, the respective charging currents may be (5.6−0.7−3)/10 ohm=190 mA and (3.7-0.7-2.5)/10 ohm=50 mA respectively. If a 150 ns minimum off-time is required for the 3.3V application, the minimum off-time for the 5V application may be as low as 50 mA*150 ns/190 mA=40 ns. This example helps illustrate that higher voltage applications may allow shorter minimum off-times while lower voltage applications may require longer minimum off-times.

Figure 2:
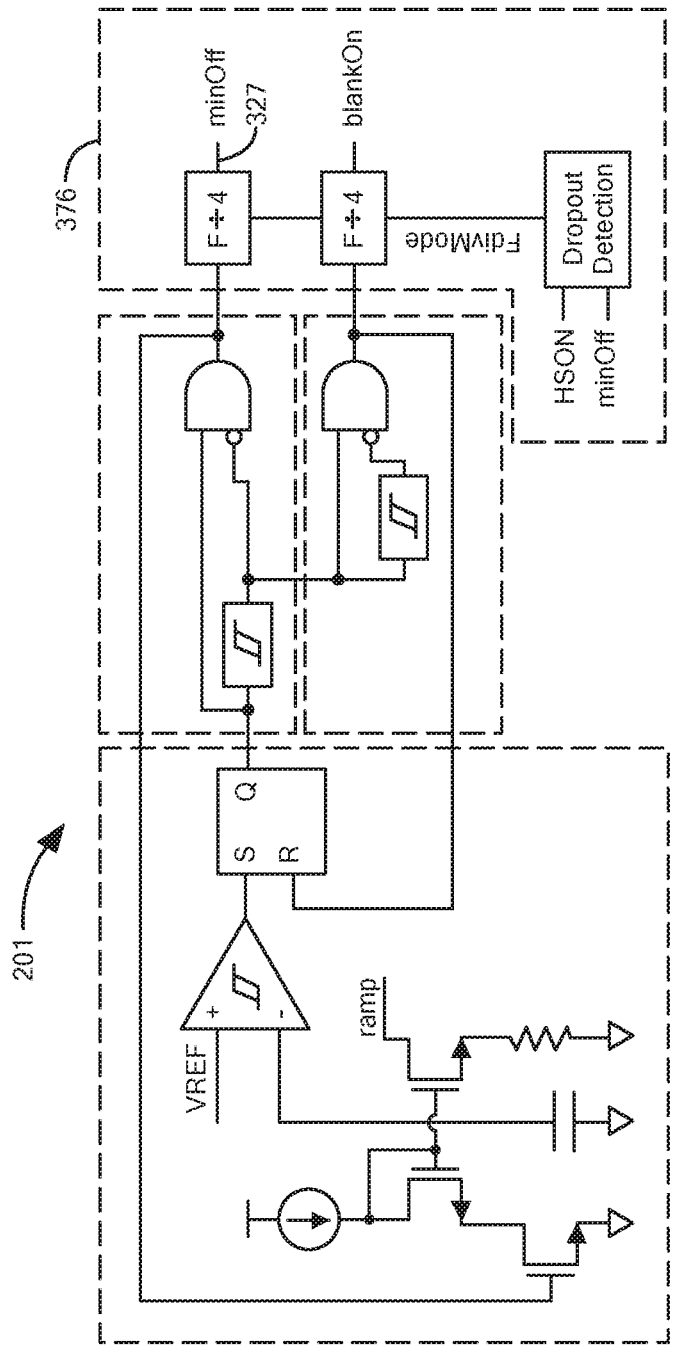
FIG. 2 is a circuit diagram of an oscillator of the prior art.

Referring to FIG. 2, oscillator circuit 201 may be an oscillator to produce a switching period for a switching voltage regulator. Oscillator circuit 201 may be the same as or similar to oscillator 38. Minimum off-time signal 327 may be the same as or similar to signal 56.

In embodiments, oscillator 201 may include a frequency division circuit 376. In lower-voltage applications, the frequency divider may be used to provide a high enough duty cycle given fixed duration of minimum off-time signal 327. Often the ramp signal 52 is generated from the same circuit that generates the oscillator period. In embodiments, frequency division may increase the resulting duty cycle from D=1−Tmin*$F_{osc}$ to D=1−Tmin*$F_{osc}$/4.

Figure 3:
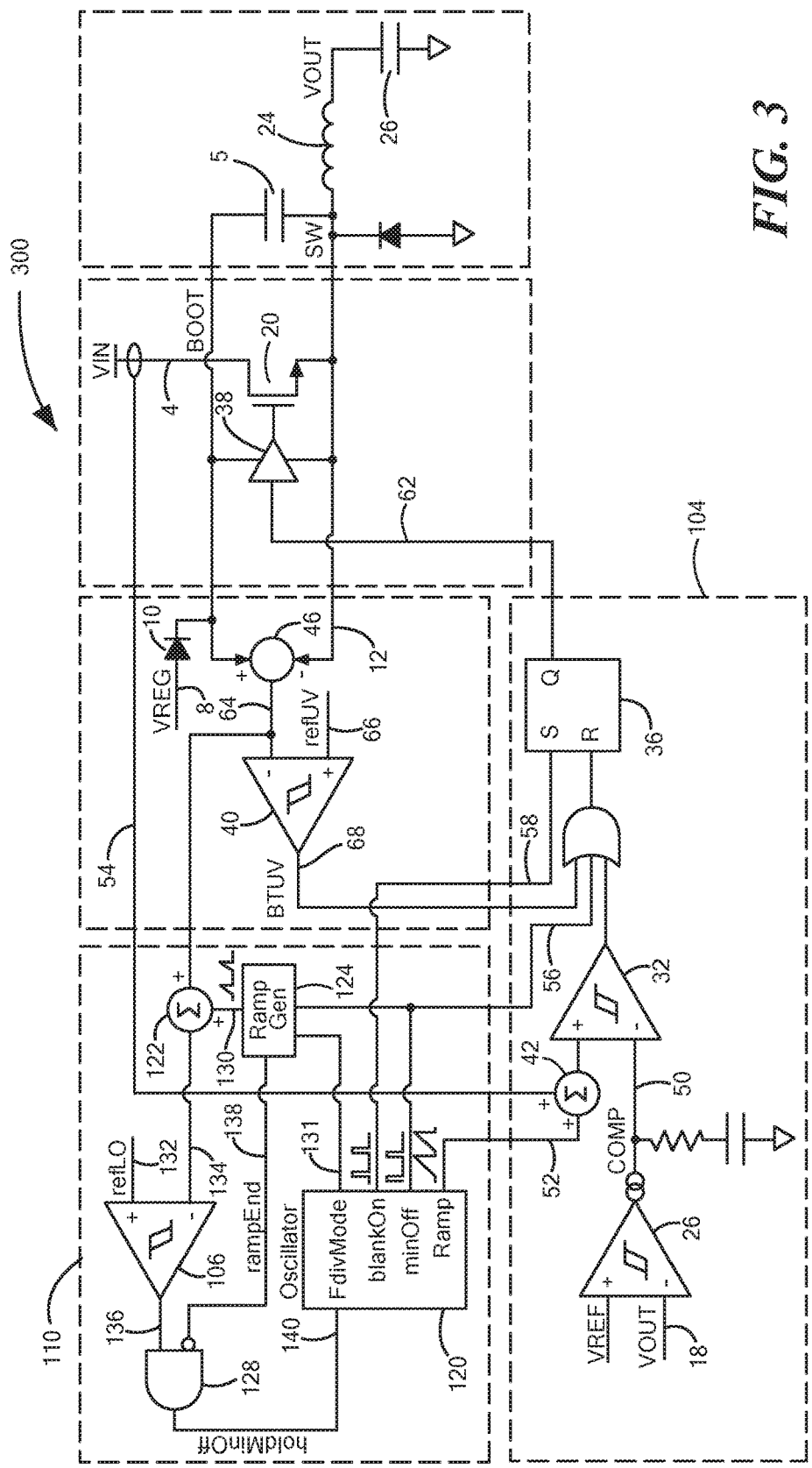
FIG. 3 is a circuit diagram of an embodiment of a switching regulator.

Referring to FIG. 3, voltage regulator 300 may provide an extended minimum off-time for applications with lower output voltages. In general, the minimum off-time produced by voltage regulator 300 may be based on the output voltage VOUT (e.g. signal 18). A ramp signal may be used to generate the minimum off-time signal.

Voltage regulator 300 includes circuit 110, which may work in conjunction with bootstrap voltage detector 46 and oscillator 120 to extend the minimum off-time generated by oscillator 120. One goal of this arrangement may be to adjust the minimum off-time in accordance with desired boot voltages. For example, the minimum off-time may be adjusted between 50 ns and 150 ns to achieve boot voltages between 2.5V and 3V.

Circuit 110 include ramp generator 124 that produces ramp signal 130. Circuit 122 may receive ramp signal 122 and differential voltage signal 64 to produce signal 134. As noted above, voltage signal 64 may represent the voltage across bootstrap capacitor 5. Signal 134 may represent the sum of differential voltage signal 64 and ramp signal 130.

Comparator 106 may receive signal 134 and compare it to a reference voltage 132. Signal 136, the output of comparator 106, may pass through AND-gate 128 as signal 140. Signal 140 may be a control signal used to extend the minimum off signal of oscillator 120. For example, comparator 106 may be configured to maintain minimum off signal 56 high when signal 140 is high, thus extending the minimum off-time signal 56 when needed. In embodiments, extension of minimum off-time signal 56 may be based on the value of signal 64, and thus based on the voltage across bootstrap capacitor 5.

The minimum boot voltage is set by the refUV signal 66 and may be selected to be well above the Vt of high side switch 20 to provide a sufficient rise time on the SW node and sufficient Rdson. When the boot voltage is below the refUV 66 limit, high side switch 20 is held off to prevent undesired operation and allow the boot voltage to rise above refUV 66. The range may be selected to reduce and/or minimize the significance of voltage ripple across bootstrap capacitor 5. In traditional systems, for example, 50 ns minimum off-time may result in a boot voltage less than refUV 66 threshold for some applications.

In embodiments, comparator 40 generating BTUV signal 68 may ensure the boot voltage is above the minimum allowable boot voltage before high side switch 20 is used. The range of the boot voltage and minimum off-time may be related to artificial voltage ramp signal 130. In one embodiment, voltage ramp signal 130 may ramp from 0V to 500 mV in 150 ns to achieve the previously outlined design targets (e.g. a minimum off-time between 50 ns and 150 ns). Comparator 106 may compare artificial ramp signal 130 to reference voltage signal 132 to produce signal 136 representing the required minimum off-time. For example, signal 136 may pass through AND-gate 128 to become signal 140, which may modulate the minOff signal generated by oscillator 120. When the holdMinOff signal 140 is continuously low, the shortest minimum off-time may result. In the examples above, the shortest minimum off-time may be about 50 ns. When the holdMinOff signal 140 is held high, the longest minimum off-times may result. Summing the artificial ramp 130 with the sensed boot voltage 64 and comparing with the refLo signal 132 results in a minimum off-time that is proportional to the sensed boot voltage 64. In other embodiments, the same result may be achieved by subtracting the artificial ramp from refLO 132. These techniques may also be implemented with digital or software methods.

In addition to implementing the artificial ramp signal 130 for the boot voltage detector, ramp generator circuit 124 may also implement the minimum off-time upper limit. The upper limit may be realized with rampEnd signal 138. When rampEnd signal 138 is high, AND-gate 128 may force holdMinOff signal 140 low, which may cause oscillator 120 to drive minOff signal 56 low. In various embodiments, the upper limit of the minimum off-time may be about 150 ns for a 2 MHz period. When in dropout, the regulator may divide the frequency of the switching by 2 or more. In this situation, a longer minimum off-time may be acceptable (e.g. 300 ns or more).

The longer upper limit may also be applied to other frequency division cases. For example, frequency division may be used during regulator startup when the output voltage is low. In addition, in certain embodiments, the modulation of the minimum off-time may also be used when only the low side switch is active (and the high side switch disabled), to charge the boot capacitor for example.

Figure 4:
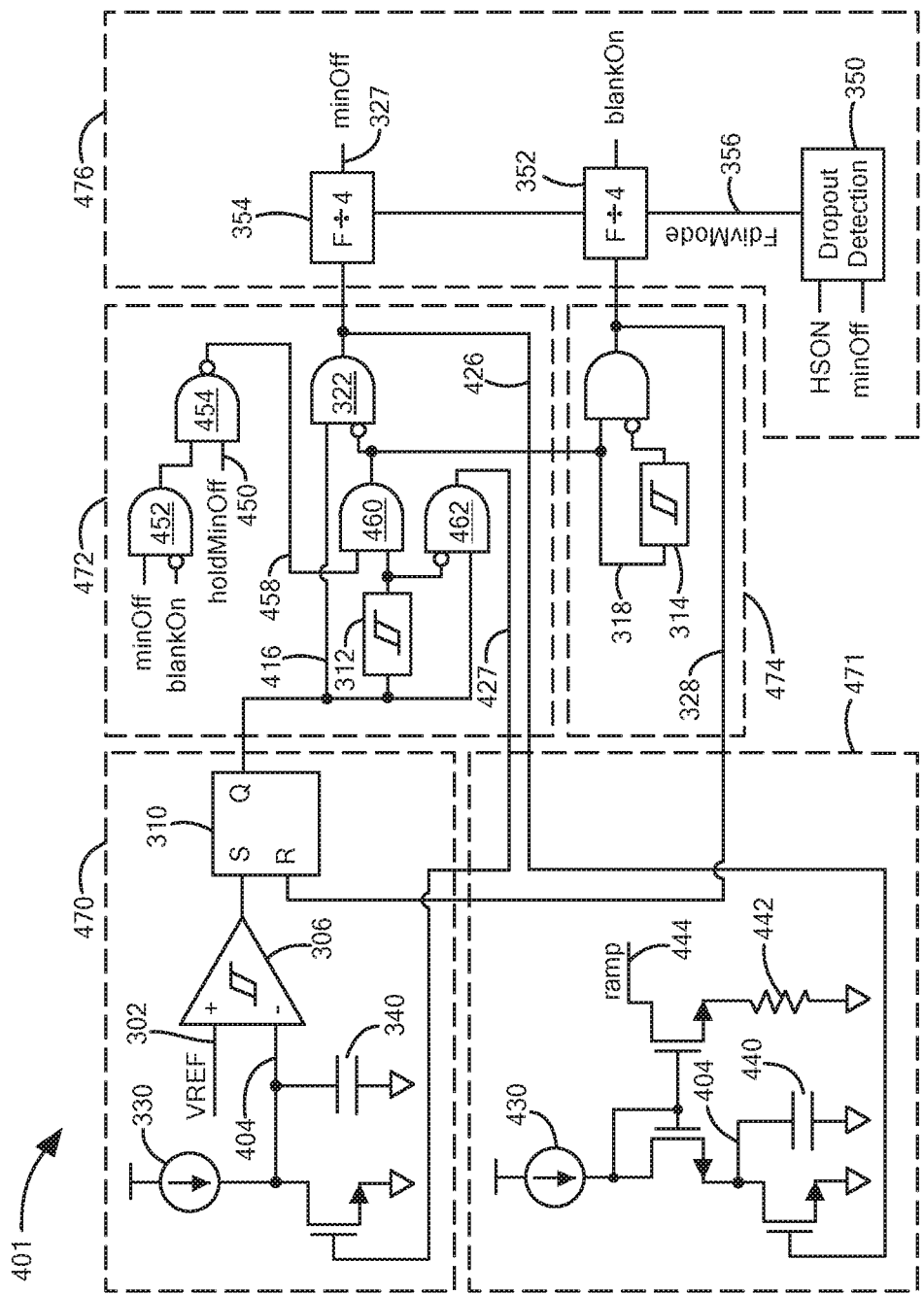
FIG. 4 is a circuit diagram of an oscillator.

Referring to FIG. 4, oscillator 401 may be the same as or similar to oscillator 120. Circuit 470 may produce signal 416, which may define the period for the oscillator. Circuit 472 may generate minimum off-time signal 426. Minimum off-time signal 426 may be the same as or similar to signal 56. And circuit 471 may produce ramp signal 444. Ramp signal 444 may be the same as or similar to signal 52. Oscillator 401 may be configured to generate minimum off-time signal 426.

Circuit 472 may include one or more logic circuits 452, 454, 460, 322, and 462 configured to generate minimum off-time signal 426. For example, as noted above, if holdMinOff signal 450 is high, then the minimum off-time signal 426 should also be high. Thus, if holdMinOff signal 450 is high, signal 458 is low, and signal 460 is low. In this case, minimum off-time signal 426, produced by gate 322, will be high as long as holdMinOff signal 450 is high and the output of latch 310 is high. In an embodiment, AND-gate 452 may be included to ensure the holdMinOff signal 450 can extend the minimum off-time signal 426 only while the minOff signal 327 is high.

Circuit 472 may also include a delay cell 312, which may realize the smallest value of the minimum off-time. For example, if holdMinOff signal 450 remains low, the minimum off-time will be defined by the value of delay circuit 312. If holdMinOff signal 450 is high, the minimum off-time (e.g. the on-time of signal 426) may be extended for the amount of time that holdMinOff signal 450 is high. In contrast if the holdMinOff signal remains low the minimum off-time will run at the lower limit. In other words, delay cell 312 may set the lower limit of the minimum off-time.

Circuit 474 also includes a delay cell 314, which may realize the minimum on time (blankOn) signal 328. So that the minimum on time signal 328 starts at the falling edge of minimum off-time 327, the delay cell 314 is connected to the output of AND-gate 460.

Circuit 470 implements the switching period (i.e. signal 416). The switching period signal 416 may be reset by minimum off-time signal 426, which may represent the lower limit for the minimum off-time. The period is implemented by charging capacitor 340 with constant current 330 until signal 404 reaches reference 302 as indicated by comparator 306. To keep the period constant and have the slope compensation ramp start with the rising edge of blankOn, the slope compensation may be realized with dedicated circuit 471, which is reset by the modulated minOff signal 426. Without the dedicated circuit either the period would be modulated with the minOff time or the ramp would not start at the rising edge of blank, which would result in unstable regulation.

The slope compensation ramp signal 444 is generated by charging capacitor 540 with a constant current from current source 430, and by and mirroring the voltage on resistor 442. In an embodiment, ramp signal 444 may be a current signal.

Circuit 476 may implement dropout frequency division. The minOff signal 426 and blankOn signal 328 are divided with digital dividers 354 and 352 respectively. In the example shown in FIG. 4, dividers 354 and 352 divide the frequency by 4 when FdivMode signal 356 is high. Otherwise the signal 426 simply passes through the divider cells 354 and 352. The FdivMode may be generated by circuit 350, which detects the event of a dropout condition and activates the frequency division. In one embodiment, circuit 350 monitors the duty cycle of high-side on ("HSON") signal 62. When the duty cycle is at a maximum value for a predetermined number of cycles, the FdivMode signal 356 is driven high. After this event the FdivMode signal 356 may go periodically high and low on a cycle-by-cycle basis to maintain regulation.

Figure 5:
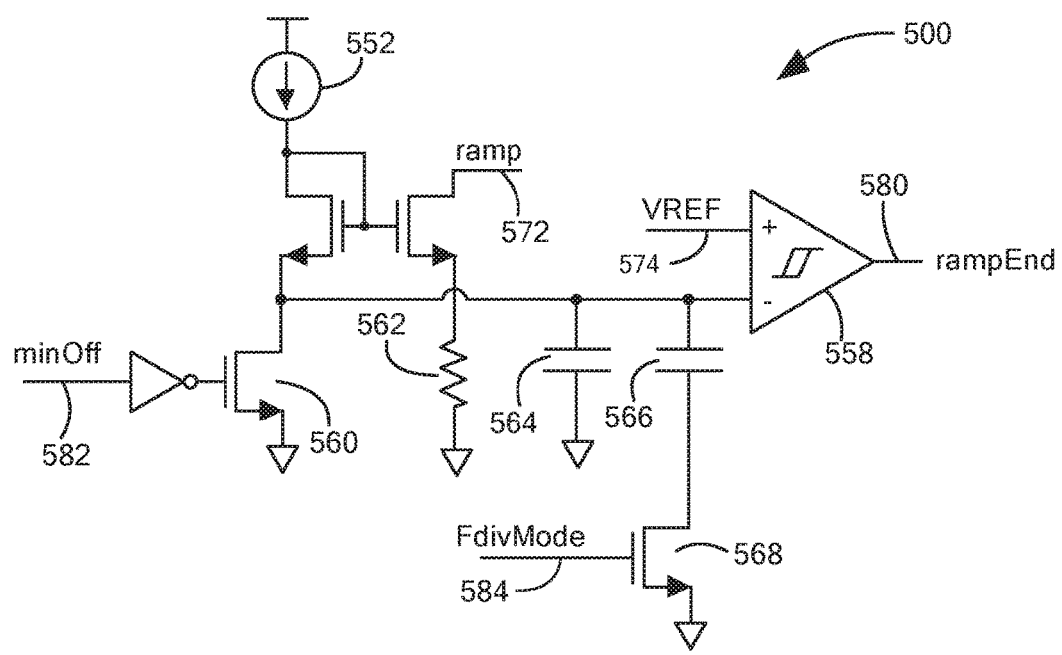
FIG. 5 is a circuit diagram of a ramp signal generator.

Referring to FIG. 5, artificial ramp generator circuit 500 may be the same as or similar to circuit 124 in FIG. 3. Ramp signal 572 may be the same as or similar to ramp signal 130. Minimum off-time signal 582 may be the same as or similar to signal 56. And FdivMode signal 584 may be the same as or similar to signal 131.

Ramp signal 572 is generated using current source 552 to charge capacitors 564 and 566 during the minimum off-time (e.g. while switch 20 is off). When minimum off-time signal 582 is low, the capacitors are held in a reset state (e.g. coupled to ground by switch 560). The ramp output of signal 572 and can be scaled with resistor 562 to set the appropriate ramp amplitude. The circuit may implement the upper limit for the minimum off-time with comparator 558. Comparator 558 may generates the rampEnd signal 580 (which may be the same as or similar to signal 138) when the voltage across capacitors 564 and 566 exceeds voltage reference 574. The upper limit for the minimum off-time may be increased in dropout frequency division by enabling capacitor 566 with NMOS switch 568.

Figure 6:
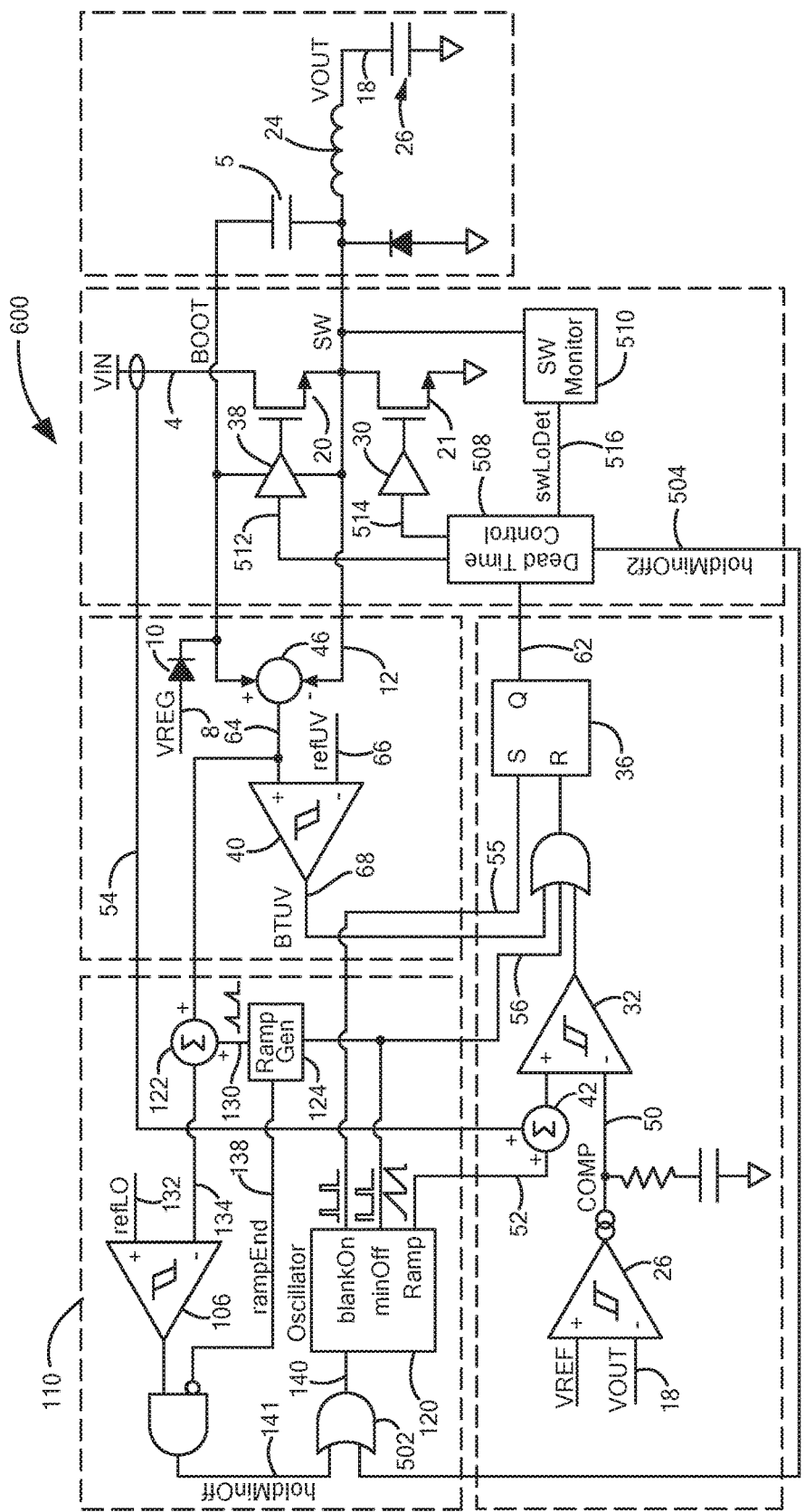
FIG. 6 is a circuit diagram of an embodiment of a switching regulator.

Referring to FIG. 6, synchronous buck converter 600 may include circuit 110, which may be used to vary the minimum off-time signal 56, as described above. In buck converter 600, the freewheel diode (e.g. diode 10) may be replaced by low side switch 21. The dead time between the high side switch turning off and the low side switch turning on can significantly impact efficiency. In an embodiment, it may be most efficient to allow the current through inductor 24 to cause the voltage at the SW node to transition from high to low, and turn the low side switch on when the SW node is low. This method may require the inductor current to be positive, and the slew rate may be dependent on the inductor current (and therefore the load). In embodiments, for heavy load currents, the slew rate can be between about 0.3 ns/V and 3V/ns. At inductor currents near zero or reverse direction, the SW node can remain high for an entire period.

Thus, there may be a time-out associated with the dead time between the high side switch turning off in the low side switch turning on. The time-out may be on the order of 20 to 40 ns, which is near the proposed minimum of time of 50 ns. Therefore, at the maximum duty cycle, SW node may not reach 0V at the minimum off-time.

In embodiments, SW monitor circuit 510 (FIG. 6) monitors SW node 12 and provides signal 516 to dead time control circuit 508 to turn on the low side switch when the SW node remains high for a predetermined time (see FIG. 9 below). The time-out for the falling edge of SW node 12 may be implemented in dead time control circuit 508. Dead time control circuit 508 may also be configured to extend the minimum off-time using holdMinOff signal 504. This arrangement enables voltage regulator 600 to realize the minimum off-time at the SW node, rather than the high-switch on ("HSON") signal 512. This allows for an aggressive minimum off-time to be achieved at both heavy and light loads, resulting in similar characteristics at the SW node for all applications.

Figure 7:
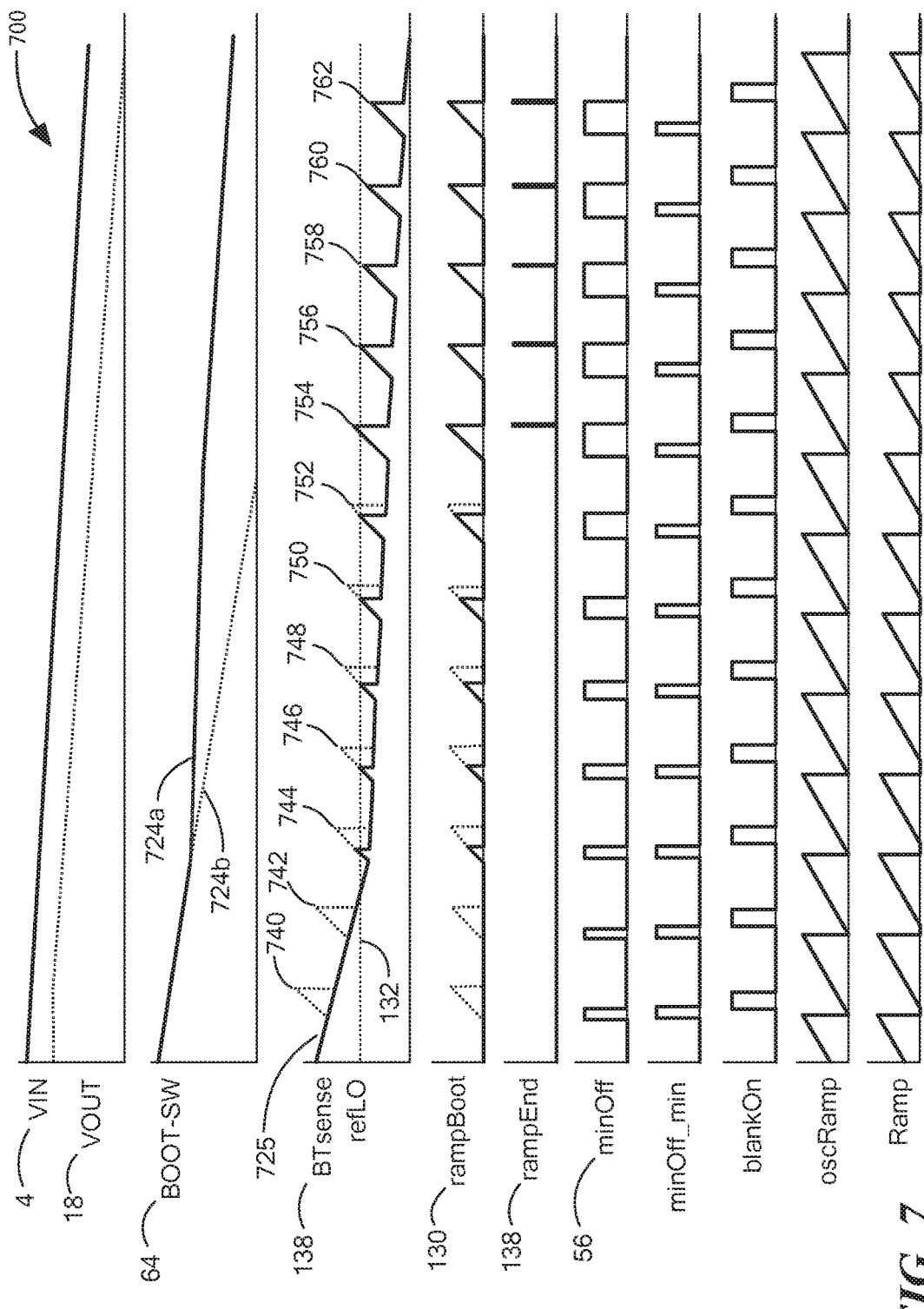
FIG. 7 is a graph of signals associated with the switching regulator of FIG. 3 and/or FIG. 6.

Referring to FIG. 7, graph 700 shows various timing signals associated with FIG. 3 (and/or FIG. 6). Specifically, FIG. 7 illustrates various timing signals as VIN signal 4 decreases. At time period 740, VIN is high enough to provide and maintain the boot voltage above the refLo reference signal 132. In this case, the regulator operates with the minimum off-time at the lower limit, which can be seen by the short width of pulse. Note, the duty cycle at SW node 12 may be unrestrained by the minimum off-time and therefore shorter than the max duty cycle.

As the VIN signal 4 descends, the supply for charging the boot capacitor (VREG signal 8) is also reduced. At period 744 the boot voltage signal 64 is no longer maintained above the refLo reference signal 132. As VIN signal 4 continues to descend, the minimum off-time may increase based on the characteristics of the artificial ramp, as illustrated by periods 744-754. For example, in these periods, the minimum off-time signal 56 has been extended, i.e. the duty cycle of minimum off-time signal 56 is greater than the duty cycle of the lower bound of the minimum off-time signal 427 in FIG. 4, which is an internal signal in oscillator 120. The modulation of the minimum off-time signal 56 may maintain the boot voltage signal 64 (and 724a) within the range of refLo signal 132, which may result in a much higher boot voltage 724a. The boot voltage of prior art systems, such as voltage regulator 2 in FIG. 1, may have a lower boot voltage that follows waveform 724b.

At lower input voltages, as illustrated during periods 754-762, the demanded minimum off-time is greater than the upper limit set by the ramp generator 124. At this point the rampEnd signal 138 may go high to truncate the holdMinOff signal 140 (e.g. by turning off AND-gate 128 in FIG. 3) and thus minOff signal 56. When this occurs the, boot voltage signal 64 may start to descend more quickly due to the fixed minimum off-time. When the minimum off-time reaches the upper limit, frequency dividing may be employed (e.g. as described above with respect to circuit 476) to achieve higher duty cycles, which may allow for longer minimum off-times with less impact.

During operation the period of oscRamp signal 52 may remain constant by resetting the ramp signal 130 rising edge of minOff_min signal signal 427 in FIG. 4. The blankOn signal 58 may trigger the start of the period, and therefore be delayed until the falling edge of minimum off-time signal 56. Finally, ramp signal 130 may be held off until the start of each period. As such, ramp signal 130 may be reset each period by the rising edge of modulated minimum off-time signal 56.

Figure 8:
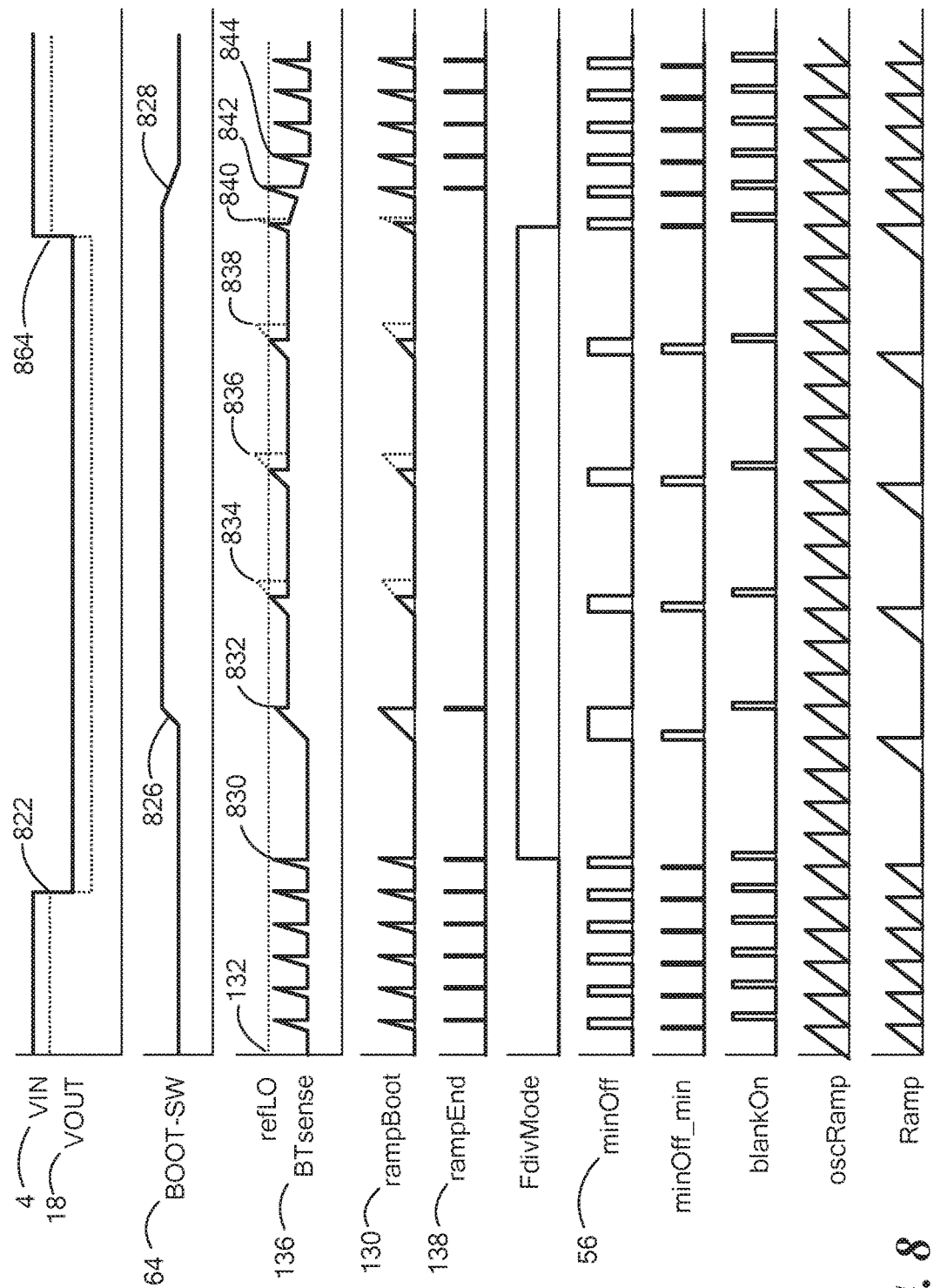
FIG. 8 is a graph of signals associated with a switching regulator including frequency division.

Referring to FIG. 8, graph 800 illustrates a case where the input voltage signal 4 momentarily drops low enough to cause dropout frequency division. In this example the switching frequency is divided by four for the dropout condition (e.g. during time periods 830-838). Due to the longer period in dropout frequency division, the upper limit for the minimum off-time signal 56 (e.g. the time that minimum off-time signal 56 may be high) may be increased without significantly impacting the resulting duty cycle. Prior to the dropout condition 822, the minimum off-time may not be long enough to maintain the boot voltage above the refLo reference 132. Therefore the rampEnd signal 610 held the minimum off-time at the upper limit. However, when the FdivMode signal 356 is high, the minOff upper limit may be sufficient to maintain the boot voltage above refLo reference 132. Thus, the boot voltage increases during period 832, which causes the minimum off-time to scale down during period 834. This allows for even higher max duty cycles to be achieved. Note that since dropout frequency division is realized with digital dividers the slope compensation ramp 620 may be blanked for the first three periods.

At time 864, input voltage signal 4 recovers causing the system to exit dropout frequency division. This may reduce the upper limit for the minimum off-time, which may result in boot voltage drop 828 after the short minimum off-time (see signal 56) in time period 840. With the change in the boot voltage signal 64, the minimum off-time signal 56 may reduce on-time, as dictated by the upper limit set by rampEnd signal 138.

Figure 9:
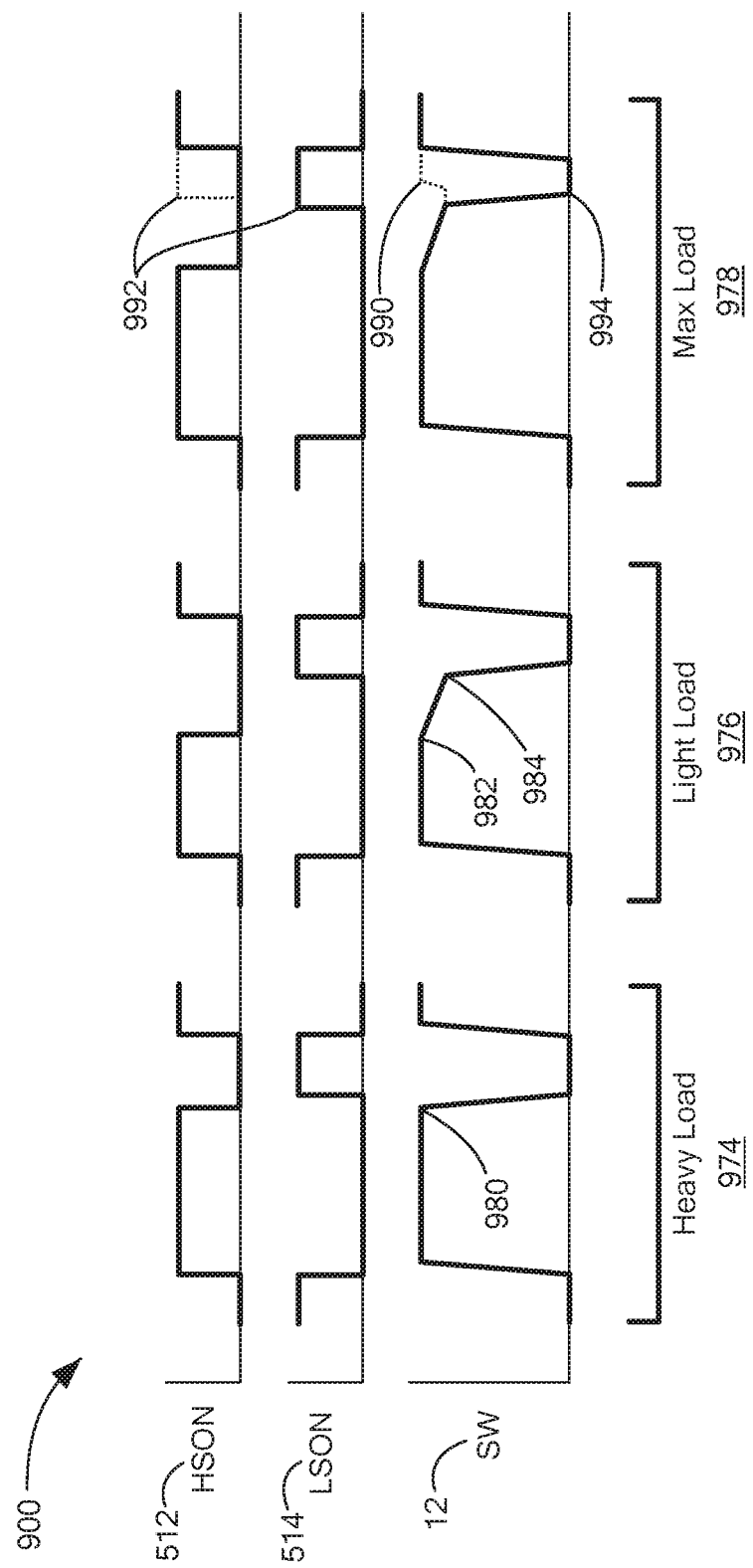
FIG. 9 is a graph of signals associated with the switching regulator of FIG. 6.

Referring to FIG. 9 and FIG. 6, graph 900 provides an illustration of the falling edge slew rate of SW signal 12 under heavy load 974, light load 976, and maximum duty cycle 978. At heavy loads, the duty cycle of SW node 12 tracks the duty cycle of high-switch on ("HSON") signal 512, as shown by point 980. At light loads the duty cycle of SW node 12 may not track the duty cycle of HSON signal 512, as shown by points 982 and 984. When operating at the maximum duty cycle, the duty cycle mismatch between SW signal 12 and HSON signal 512 may case cause the SW node to remain high, without dropping low, as shown by dotted line 990. In embodiments, holdMinOff signal 141 (see FIG. 6) may extend the minimum off-time, allowing the SW node to go low at point 994. The minimum off-time may, in an embodiment, be set by the rising edge of low-switch on ("LSON") signal 514, as by points 992. This approach may provide a sufficient minimum off-time at the SW node, and also keep the boot circuit charged, and allow for a shortened VIN fault at the SW node to be properly detected.

Having described preferred embodiments, which serve to illustrate various concepts, structures and techniques, which are the subject of this patent, it will now become apparent to those of ordinary skill in the art that other embodiments incorporating these concepts, structures and techniques may be used. Various examples are described above to illustrate the subject matter of this disclosure. One skilled in the art will recognize that examples, including specific numerical values of voltages, currents, and other values, are non-limiting examples used to illustrate and elucidate concepts, structures, and techniques. Accordingly, the scope of the patent should not be limited to the described embodiments but rather should be limited only by the spirit and scope of the following claims. All references cited in this document are incorporated by reference in their entirety.

The invention claimed is:

1. A voltage regulator comprising:
   a switch having a control terminal;
   a bootstrap capacitor coupled to the switch;
   a control circuit coupled to a control terminal of the switch and configured to open the switch to allow the bootstrap capacitor to charge and close the switch to allow the bootstrap capacitor to stop charging;
   an oscillator circuit that produces a minimum off-time signal that defines a minimum time for the switch to be open and for the bootstrap capacitor to charge;
   an under-voltage detection circuit that monitors a voltage across the bootstrap capacitor and, if the voltage across the bootstrap capacitor is less than a predetermined threshold, generates a signal that causes the switch to remain open; and
   a minimum off-time circuit that adjusts the minimum off-time signal based on a reference voltage and the voltage across the bootstrap capacitor;
   wherein:
   the minimum off-time circuit comprises a ramp generator circuit that produces a ramp signal; and
   the minimum off-time circuit combines the voltage across the bootstrap capacitor and the ramp signal to produce a modulated signal by summing the voltage across the bootstrap capacitor and the ramp signal.

2. The voltage regulator of claim 1 wherein the ramp signal is a sawtooth signal.

3. The voltage regulator of claim 1 wherein the ramp generator circuit comprises a current source coupled to a capacitor.

4. The voltage regulator of claim 3 wherein the current source is configured to provide a constant current to charge the capacitor at a substantially constant rate.

5. The voltage regulator of claim 3 wherein the current source is a variable current source.

6. The voltage regulator of claim 3 wherein the ramp signal corresponds to a voltage across the capacitor of the ramp generator circuit.

7. The voltage regulator of claim 1 wherein the ramp generator circuit comprises an input terminal coupled to receive the minimum off-time signal.

8. The voltage regulator of claim 7 wherein the ramp generator circuit generates a voltage ramp in response to the minimum off-time signal.

9. The voltage regulator of claim 1 wherein the voltage regulator is a buck regulator.

10. The voltage regulator of claim 1 further comprising a low-side switch coupled to the bootstrap capacitor.

11. The voltage regulator of claim 10 further comprising a dead-time control circuit configured to operate the switch and the low-side switch.

12. The voltage regulator of claim 10 further comprising an inductor coupled to the switch and the low-side switch, wherein a slew rate of the ramp signal is responsive to a current through the inductor.

13. The voltage regulator of claim 1 wherein the switch is a field-effect transistor.

14. The voltage regulator of claim 1 wherein the switch is a high side switch, and the voltage regulator further comprises a low side switch.

15. The voltage regulator of claim 14 further comprising a voltage monitor circuit that monitors a voltage between the high side switch and the low side switch, and that generates a signal to turn the low side switch on if the voltage between the high side switch and the low side switch remains high for a predetermined time.

16. A voltage regulator comprising: a switch having a control terminal; a bootstrap capacitor coupled to the switch; and a control circuit coupled to a control terminal of the switch and configured to open the switch to charge the bootstrap capacitor and close the switch to stop charging the bootstrap capacitor; means for producing a minimum off-time signal that defines a minimum time for the switch to be open and for the capacitor to charge; means for monitoring a voltage across the bootstrap capacitor and, if the voltage across the bootstrap capacitor is less than a predetermined threshold, generating a signal that causes the switch to remain open; means for adjusting the minimum off-time signal to allow the bootstrap capacitor to remain in a charged state; means for producing a ramp signal; means for combining the voltage across the bootstrap capacitor and the ramp signal; and means for summing the voltage across the bootstrap capacitor and the ramp signal to produce a modulated signal.

17. A voltage regulator comprising:
    a switch having a control terminal;
    a bootstrap capacitor coupled to the switch;
    a control circuit coupled to a control terminal of the switch and configured to open the switch to allow the bootstrap capacitor to charge and close the switch to allow the bootstrap capacitor to stop charging;
    an oscillator circuit that produces a minimum off-time signal that defines a minimum time for the switch to be open and for the bootstrap capacitor to charge;
    an under-voltage detection circuit that monitors a voltage across the bootstrap capacitor and, if the voltage across the bootstrap capacitor is less than a predetermined threshold, generates a signal that causes the switch to remain open; and
    a minimum off-time circuit that adjusts the minimum off-time signal based on a reference voltage and the voltage across the bootstrap capacitor;
    wherein:
    the minimum off-time circuit comprises a ramp generator circuit that produces a ramp signal; and
    the minimum off-time circuit combines the voltage across the bootstrap capacitor and the ramp signal to produce a modulated signal; and
    the minimum off-time circuit comprises a comparator that compares the modulated signal to a reference voltage to produce a hold signal.

18. The voltage regulator of claim 17 wherein the oscillator circuit is coupled to receive the hold signal and the hold signal modulates the minimum off-time signal.

19. The voltage regulator of claim 17 wherein the ramp signal is a sawtooth signal.

20. The voltage regulator of claim 17 wherein the ramp generator circuit comprises a current source coupled to a capacitor.

21. The voltage regulator of claim 20 wherein the current source is configured to provide a constant current to charge the capacitor at a substantially constant rate.

22. The voltage regulator of claim 20 wherein the current source is a variable current source.

23. The voltage regulator of claim 20 wherein the ramp signal corresponds to a voltage across the capacitor of the ramp generator circuit.

24. The voltage regulator of claim 17 wherein the ramp generator circuit comprises an input terminal coupled to receive the minimum off-time signal.

25. The voltage regulator of claim 24 wherein the ramp generator circuit generates a voltage ramp in response to the minimum off-time signal.

26. The voltage regulator of claim 17 wherein the voltage regulator is a buck regulator.

27. The voltage regulator of claim 17 further comprising a low-side switch coupled to the bootstrap capacitor.

28. The voltage regulator of claim 27 further comprising a dead-time control circuit configured to operate the switch and the low-side switch.

29. The voltage regulator of claim 27 further comprising an inductor coupled to the switch and the low-side switch, wherein a slew rate of the ramp signal is responsive to a current through the inductor.

30. The voltage regulator of claim 17 wherein the switch is a field-effect transistor.

31. The voltage regulator of claim 17 wherein the switch is a high side switch, and the voltage regulator further comprises a low side switch.

32. The voltage regulator of claim 31 further comprising a voltage monitor circuit that monitors a voltage between the high side switch and the low side switch, and that generates a signal to turn the low side switch on if the voltage between the high side switch and the low side switch remains high for a predetermined time.

\* \* \* \* \*